United States Patent
Savino et al.

(10) Patent No.: US 6,781,497 B1
(45) Date of Patent: Aug. 24, 2004

(54) APPARATUS AND METHOD FOR SITUATING AN INDUCTIVE ELEMENT ONTO A ROD IN AN ELECTRICAL CIRCUIT

(76) Inventors: Vito Savino, 2101 Blackfoot Trail, Mesquite, TX (US) 75149; James Richard Walton, 1292 E. Remington Park, Terrell, TX (US) 75160

( * ) Notice: Subject to any disclaimer, the term of this patent is extended or adjusted under 35 U.S.C. 154(b) by 117 days.

(21) Appl. No.: 09/596,163

(22) Filed: Jun. 16, 2000

(51) Int. Cl.[7] .............................................. H03H 2/00
(52) U.S. Cl. ..................................... 336/175; 439/620
(58) Field of Search ......................... 439/620; 336/175; 361/302; 333/181–186

(56) References Cited

U.S. PATENT DOCUMENTS 4,020,430 A * 4/1977 Vander Heyden
4,675,629 A * 6/1987 Sakamoto et al. .......... 333/182
5,990,756 A * 11/1999 France, Jr. et al. ......... 336/175

* cited by examiner

*Primary Examiner*—Neil Abrams
(74) *Attorney, Agent, or Firm*—Law Office of Donald D. Mondul

(57) ABSTRACT

An apparatus for situating a toroidal inductor having an inductor inner dimension, such as a ferrite bead, onto a rod having a diametral dimension. The apparatus comprises a flexible tubular supporter that has a first end, a second end, a support inner dimension substantially equal to the diametral dimension and a support outer dimension. The supporter flexes when installing the inductor to establish the support outer dimension at less than the inductor inner dimension to allow the inductor to surround the supporter and rod situated intermediate the first and second end with the supporter flexed to establish the support outer dimension at greater than the inductor inner dimension intermediate the inductor and the first and second end. Alternatively, the supporter may be a molded or snap-on cover substantially enclosing the inductor with apertures for frictionally fitting over a rod to secure the inductor in place.

11 Claims, 4 Drawing Sheets

APPARATUS AND METHOD FOR SITUATING AN INDUCTIVE ELEMENT ONTO A ROD IN AN ELECTRICAL CIRCUIT

BACKGROUND OF THE INVENTION

The present invention is used for limiting electromagnetic interference (EMI) in electrical components as they are employed in electrical circuitry. One challenge for designing an electrical circuit is the reduction of electromagnetic interference (EMI) during operation of the circuit. One approach for effecting EMI reduction has been to design circuits in manners to confine components that are sources of EMI to restricted areas. Such an approach is marginally effective and contributes significantly to the time and talent required for circuit layout design. Increased time and talent in design contributes to the cost of circuit layout design, both in dollars and in time required. Many such early designs also proved difficult to manufacture on a production scale with acceptable manifested operating parameters.

Some of the earlier layout techniques included laying specified circuit traces atop one another in an effort to arrange for interlayer electromagnetic interference to cancel out. Another approach has been to place a ferrous bead on a wire connector (such as, for example a jumper wire), or on at least one lead of an electrical component (such as a transistor). Such ferrous beads provided a one-turn inductor. In using a ferrous bead, for example, in connection with a field effect transistor (FET), a bead may be installed on the source lead, on the drain lead, or on both the source lead and the drain lead. Such an addition of a one-turn inductor to the leads affects rise time or other operating characteristics of the FET in a manner that ameliorates the effects of high frequency noise on the FET. High frequency noise is a significant source of EMI. It is a characteristic of Fast Fourier Transform circuitry that a transform having a square shape involves a significant amount of high frequency noise. If the Fast Fourier Transform has the shape of a trapezoid (which would occur, for example, if rise times are affected), there are significantly fewer high frequency harmonics. Fewer high frequency harmonics means less EMI.

Ferrous beads employed on component leads also affect noise spikes. Ferrous beads installed encircling component leads absorb energy at high frequency and, therefore, suppress noise spikes.

The electrical benefits of ferrous beads in ameliorating effects of high frequency harmonics and noise spikes are evident and desirable. There is, however, a physical aspect of installation of the ferrous beads that has so far proven to be detrimental. The beads must be physically affixed in one place. If a bead is able to "rattle around" on a component lead, or a jumper wire or another bead-bearing structure, it will eventually increase the tendency of the bead-bearing structure to break. Indeed, vibration tests in which ferrous beads have become loose from their physically affixing restraint have yielded significant broken parts. One solution in the prior art has been to hot glue or otherwise adhesively affix a bead in place. Vibration tests yielded broken adhesive joints and subsequent broken bead-bearing structures.

There is a need for an apparatus for facilitating employment of ferrous beads to realize their electrical advantages without suffering the physical damage to a circuit in vibratory conditions.

SUMMARY OF THE INVENTION

An apparatus for affixing an inductive element in association with a rod within an electrical circuit is disclosed. The rod has a diametral dimension. In its preferred embodiment, the rod is a shaped rod with four or more sides. The inductive element has a generally toroidal shape with an inductive element inner dimension. The apparatus comprises a support member that is flexible to a plurality of orientations including an installing orientation and an installed orientation. The support member is substantially tubular with a first end, a second end and an inner wall defining a support member inner dimension and an outer wall defining a support member outer dimension. The support member inner dimension is substantially equal to the diametral dimension. The support member flexes to the installation orientation when installing the inductive element. The installation orientation establishes the support member outer dimension at less than the inductive element inner dimension appropriately to allow sliding installation of the inductive element about the support element and the rod to an installed position. The installed position is achieved when the inductive element surrounds the support member and the rod with the inductive element situated intermediate the first end and the second end with the support member flexed to the installed orientation. The installed orientation establishes the support member outer dimension at greater than the inductive element inner dimension intermediate the inductive element and at least at one end of the first end and the second end. A method for installing an inductive toroidal element upon a rod in an electrical device is also disclosed. The rod has a first longitudinal axis and a diametral dimension. The toroidal element presents an aperture having an inner toroid dimension. The method comprises the steps of: (a) providing a flexible insulative support member; the support member having a second longitudinal axis extending from a first end to a second end, an inner support dimension generally equal to the diametral dimension and an outer support dimension generally equal to the inner toroid dimension; (b) flexing the support element to situate the support element within the aperture with the toroidal element intermediate the first end and the second end to establish an assembly; (c) situating the assembly upon the rod with the first longitudinal axis generally aligned with the second longitudinal axis; and (d) slidingly positioning the assembly with respect to the rod to achieve an operational locus.

Prior art mounting of inductive elements, such as ferrous beads, on rods, such as component leads or jumper wires, in electrical circuits have not successfully affixed the beads in place. Normal vibration and other forces work the inductive elements loose during normal operation of the electrical circuits. As a consequence, broken leads, cracked beads and related problems have been experienced.

A further advantage of the present invention in each of its embodiments is that the support member absorbs shock forces that may be experienced by an inductor assembly according to the present invention, thereby reducing effects of forces upon the rod as well as upon the inductor member and reducing the risk of fracture or breaking of the rod, inductor member or joints associated with including the rod within an electrical circuit.

It is, therefore, an object of the present invention to provide an apparatus and method for affixing an inductive element with a rod in an electrical circuit that withstands dislodgment and shock forces during operation of the circuit.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
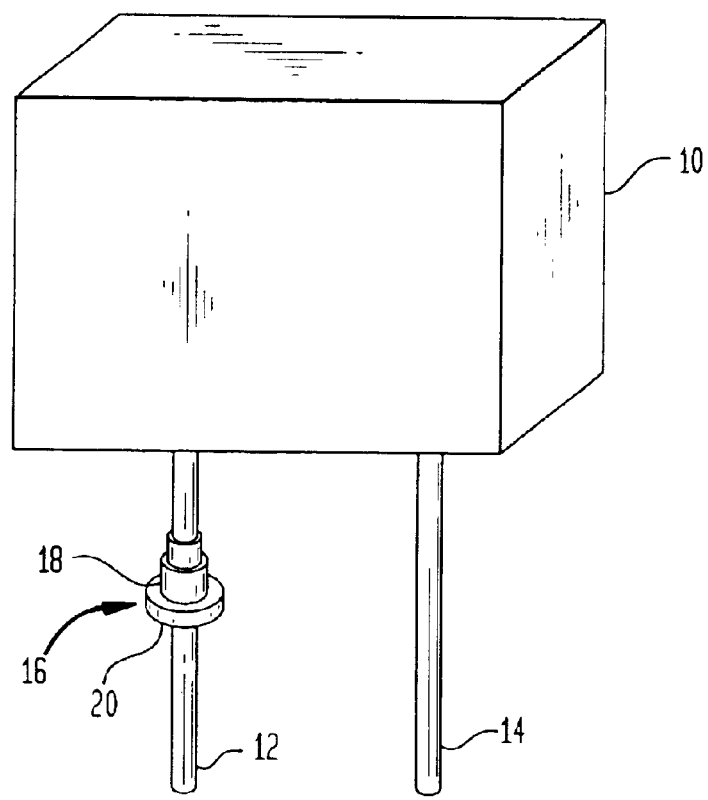
FIG. 1 is a perspective drawing illustrating the preferred embodiment of the present invention installed upon a component lead.

FIG. 1 is a perspective drawing illustrating the preferred embodiment of the present invention installed upon a component lead. In FIG. 1, an electrical component 10 has component leads 12, 14. Component leads 12, 14 are in the shape of rods, which may have a cross-section in the shape of a circle, an ellipse, a square, or any other polygon. Component leads 12, 14 have a diametral dimension which is measured at the maximum extremes of the polygonal rod cross-section in order to ascertain what clearance is necessary to fit the rod within a support member, as shall be described hereinbelow. An inductor assembly 16 constructed according to the present invention is associated with component leg 12. Inductor assembly 16 is comprised of an inductor member 18 and a support member 20. Support member 20 is in surrounding relation with component leg 12. Inductor member 18 is in surrounding relation with support member 20 and component leg 12. As will be described in greater detail hereinafter, clearances and dimensions among component leg 12, support member 20 and inductor member 18 are appropriate to establish an interference fit, or a gripping relation among component leg 12, support member 20 and inductor member 18 sufficient for inductor assembly 16 to withstand being dislodged from the installed position upon component leg 12 illustrated in FIG. 1 during operational employment of electrical component 10 and any shipping conditions that component 10 may experience.

Figure 2A:
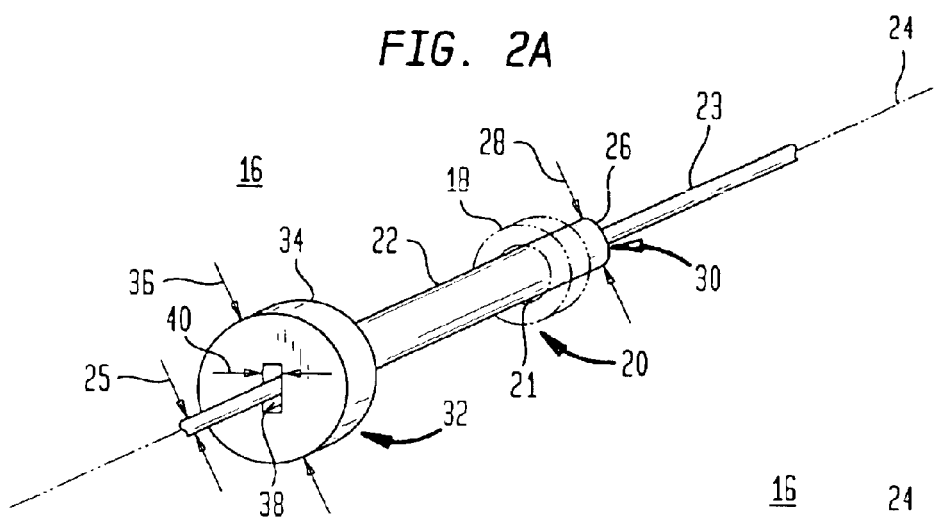
FIGS. 2(a)–(c) are perspective drawings illustrating installation of an inductive element using the present invention.
Figure 2B:
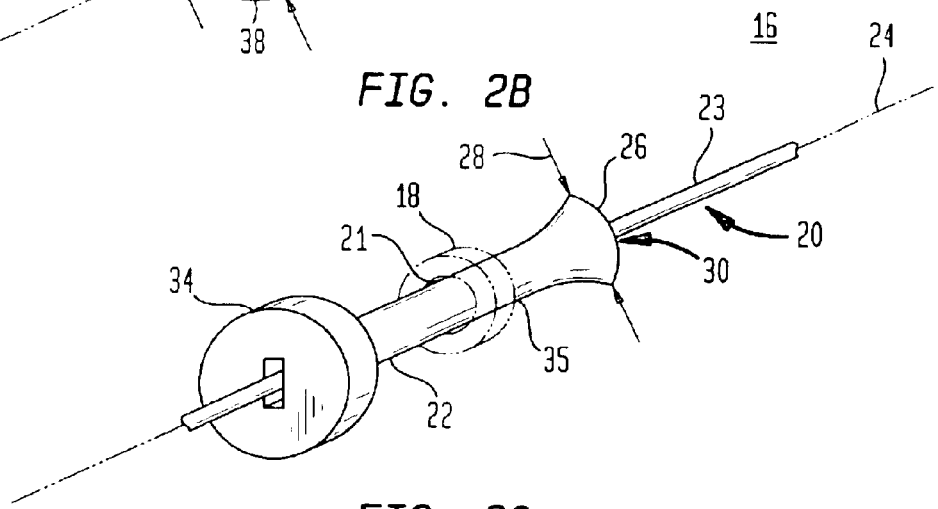
Figure 2C:
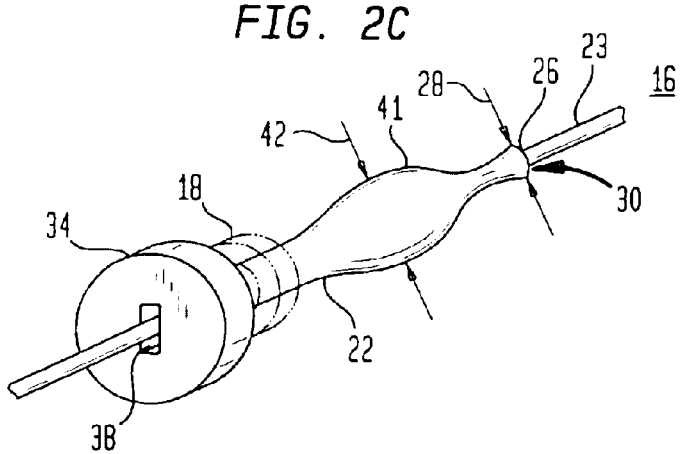

FIGS. 2(a)–(c) are perspective drawings illustrating installation of an inductive element using the present invention. In FIG. 2(a), an inductor member 18 (illustrated in phantom in FIG. 2) is in an installing orientation with a support member 20. In its preferred embodiment, support member 20 is constructed of flexible insulative material, such as a moldable plastic material. Inductor member 18 has an inner toroid dimension 21. Support member 20 is illustrated in FIG. 2 in its preferred embodiment as a grommet having a tubular section 22 generally oriented about a rod 23 substantially coaxially with respect to a longitudinal axis 24. Rod 23 may, for example, be a component lead or a jumper wire which may have a cross-section in the shape of a circle, an ellipse, a square, or any other polygon. Rod 23 has a diametral dimension 25, which is measured at the maximum extremes of the polygonal rod cross-section in order to ascertain what clearance is necessary to fit rod 23 within support member 20. At a first end 26 of support member 20, tubular section 22 establishes a support member outer dimension 28 and a support member inner dimension 30. In the installing orientation illustrated in FIG. 2(a), support member inner dimension 30 is preferably substantially equal to or less than diametral dimension 25, and support member outer dimension 28 is preferably substantially equal to or less than inner toroid dimension 21. The relative dimensions are arranged to be "substantially equal to or less than" adjacent dimensions, as described briefly immediately above, in order to take advantage of the flexibility of the plastic material of which support member 20 is constructed. Specifically, when support member inner dimension 30 is substantially equal to diametral dimension 25, rod 23 must necessarily flexibly displace some material of support member 20 as support member 20 is slidingly arranged on rod 23. Such displacement of material enhances the desired tight fit, a gripping arrangement between support member 20 and rod 23, when inductor assembly 16 is installed on rod 23 according to the present invention. Similarly, when support member outer dimension 28 is substantially equal to inner toroid dimension 21, inductor member 18 must necessarily flexibly displace some material of support member 20 as inductor member 18 is slidingly arranged on support member 20. Such displacement of material enhances the desired tight fit, a gripping arrangement between inductor member 18 and support member 20, when inductor assembly 16 is installed on rod 23 according to the present invention.

At a second end 32 of support member 20, a flange, or shoulder 34 is integrally formed with tubular section 22. Shoulder 34 extends generally perpendicularly from longitudinal axis 24 to a shoulder dimension 36. Preferably, shoulder dimension 36 is significantly greater than inner toroid dimension 21 to ensure that inductor member 18 will not disengage from support member 20 by sliding off at second end 32.

In the preferred embodiment of the present invention illustrated in FIG. 2, shoulder 34 has an aperture 38 with an aperture dimension 40. Tubular section 22 has a longitudinal aperture therethrough (not shown in detail in FIG. 2) substantially coaxial with axis 24 that is communicative with aperture 38 of shoulder 34 and receives rod 23. Preferably, aperture dimension 40 is substantially equal to or less than diametral dimension 25 to further ensure a sturdy interference fit, or gripping relation, between support member 20 and rod 23.

In FIG. 2(b), installation of inductor member 18 has further progressed by sliding inductor member 18 further upon support member 20 toward shoulder 34. In the interim installing position illustrated in FIG. 2(b), first end 26 of tubular section 22 extends further from inductor member 18 than was the case in the initial installing position illustrated in FIG. 2(a). Tubular section 22 is preferably manufactured with a set to it that establishes support member outer dimension 28 greater than inner toroid dimension 21. Thus, when tubular section 22 sufficiently clears inductor member 18, as in the interim installation position illustrated in FIG. 2(b), first end 26 flexes to increase support member outer dimension 28 and support member inner dimension 30. Support member outer dimension 28 preferably increases sufficiently to become greater than inner toroid dimension 21. Thus, even in the interim installation position illustrated in FIG. 2(b), inductor member 18 is captively contained between ends 26, 32 of support member 20. Support member inner dimension 30 is still substantially equal to or less than diametral dimension 25 at a locus 35 displaced from first end 26, so that a gripping relation between support member 20 and rod 23 is still maintained.

In FIG. 2(c), inductor member 18 is fully installed upon support member 20 substantially abutting shoulder 34. Tubular section 22 has assumed its "set" imposed during its manufacture to grippingly engage rod 23 at first end 26 and to establish a bulge 41 between first end 26 and inductor member 18 to a lateral dimension 42 that is greater than inner toroid dimension 21 (not visible in FIG. 2(c)). A gripping relation is also effected at least by aperture 38 in shoulder 34, as previously described in connection with FIG. 2(a). In the preferred embodiment of the present invention, tubular section 22 participates in effecting the gripping relation.

Figure 3:
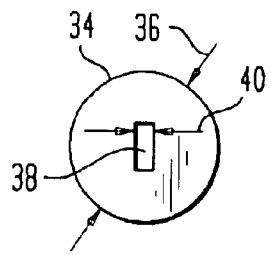
FIG. 3 is a plan view of a preferred embodiment of one aspect of the apparatus of the present invention.

FIG. 3 is a plan view of a preferred embodiment of one aspect of the apparatus of the present invention. In FIG. 3, shoulder 34 is configured in a generally circular shape with a shoulder dimension 36. The circular shape of shoulder 36 is representative only; shoulder 36 may just as well be in the shape of an ellipse, a square, or any other polygon and remain within the scope of the invention. The salient feature of shoulder 34 is that a maximum dimension (e.g., shoulder dimension 36) be greater than inner toroid dimension 21 in order to assure that shoulder 34 may perform as a stop to disengagement of inductor member 18 from support member 20 at second end 32. Aperture 38 has an aperture dimension 40 configured to be substantially equal to or less than diametral dimension 25 of rod 23 in order to assure the desired gripping relation between shoulder and rod 23. Aperture 38 is illustrated in the preferred embodiment of shoulder 34 illustrated in FIG. 3 as being rectangular in shape. Aperture 38 may be in the shape of an oval, a circle, a square or any other polygon and remain within the scope of the invention. It is a desired characteristic of aperture 40 that a minimum dimension (e.g., aperture dimension 40) be substantially equal to or less than diametral dimension 25 of rod 23 in order to assure the desired gripping relation between shoulder and rod 23. In the preferred embodiment of the present invention, tubular section 22 participates in effecting the gripping relation.

Figure 4:
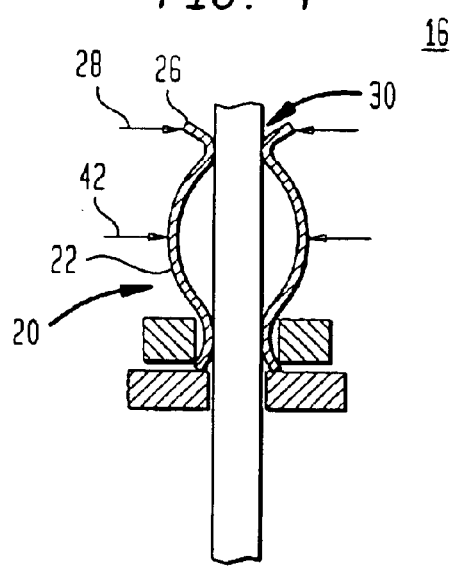
FIG. 4 is a partial section view illustrating the preferred embodiment of the present invention installed upon a rod.

FIG. 4 is a partial section view illustrating the preferred embodiment of the present invention installed upon a rod. In FIG. 4, installed inductor assembly 16 includes inductor member 18 installed with support member 20 upon rod 23. Inductor member 18 substantially abuts shoulder 34. Shoulder 34 grippingly engages rod 23 by aperture 38 having aperture dimension 40 substantially equal to or less than the diametral dimension 25 of rod 23. Shoulder dimension 36 is greater than inner toroid dimension 21 to assure that inductor member 18 does not disengage from support member 20 at second end 32 of support member 20. The intended "set" is taken by tubular section 22 of support member 20 to establish a lateral dimension 42 greater than inner toroid dimension 21 between inductor member 18 and first end 26 of support member 20. By this lateral dimension 42 inductor member 18 is prevented from disengaging from support member 20 at first end 26. Support member inner dimension 30 is substantially equal to or less than diametral dimension 25 and may provide a gripping relation between support member 20 and rod 23 at first end 26 of support member 20.

Figure 5:
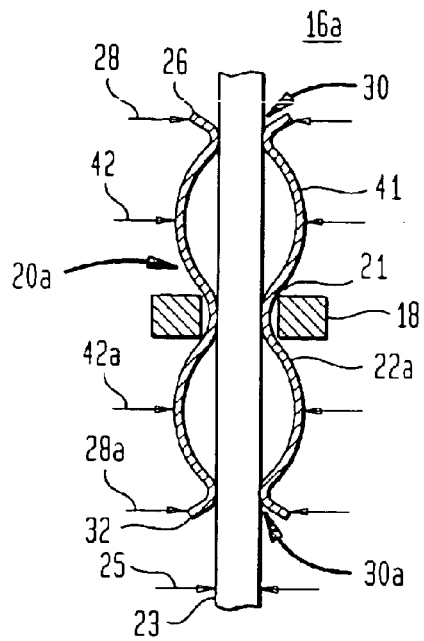
FIG. 5 is a partial section view of a first alternate embodiment of the apparatus of the present invention.

FIG. 5 is a partial section view of a first alternate embodiment of the apparatus of the present invention. In FIG. 5, inductor assembly 16a includes inductor member 18 installed with support member 20a upon rod 23. Tubular section 22a is substantially similar with tubular section 22 (FIGS. 1–4) adjacent first end 26. Support member inner dimension 30 effects a gripping relation with rod 23 and lateral dimension 42 at bulge 41 prevents dislodgment of inductor member 18 from support member 22a at first end 26. Inductor assembly 16a differs from inductor member 16 (FIGS. 1–4) in that inductor assembly 1a does not have an integrally formed shoulder at second end 32. Instead, inductor assembly 16a is substantially symmetrical in its construction presenting a bulge 41a establishing a lateral dimension 42a greater than inner toroid dimension 21. Lateral dimension 42a prevents dislodgment of inductor member 18 from support member 22a at second end 32. Support member inner dimension 30a effects a gripping relation with rod 23 to assist maintaining inductor assembly 16a at its installed position on rod 23.

Each of the embodiments of the present invention illustrated or discussed herein is depicted as comprising separate elements of inductor member (e.g., inductor member 18, FIGS. 1, 2, 4, and 5) and support member (e.g., support member 20, FIGS. 1–4 support member 20a, FIG. 5). The present invention may also be manufactured by molding an inductor member and a support member into a unitary piece for installation on a rod. The final product manifestation is within the scope of the present invention in so far as a flexible support member maintains an installed position upon a rod and holds an inductor member in an installed position on the rod.

Figure 6:
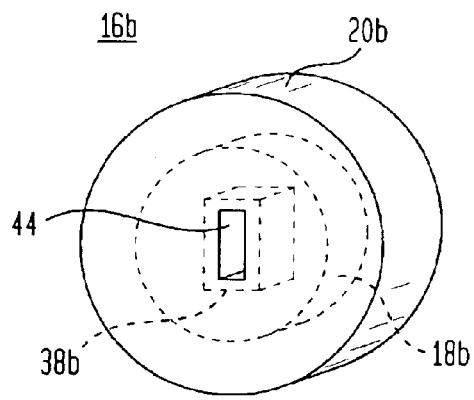
FIG. 6 is an isometric view of a second alternate embodiment of the apparatus of the present invention.

FIG. 6 is an isometric view of a second alternate embodiment of the apparatus of the present invention. In FIG. 6, an inductor assembly 16b includes an inductor member 18b (shown in phantom in FIG. 6) and a support member 20b. Support member 20b is applied to inductor member preferably by dipping, or by a similar process whereby inductor member 18b is substantially encased within support member 20b. Inductor member 18b includes an aperture 38b. Aperture 38b is at least partially filled by support member 20b present a reduced aperture 44 having dimensions reduced from the original dimensions presented by aperture 38b. By such a structure inductor assembly 16b presents a yieldable reduced-dimension aperture (i.e., reduced aperture 44) for receiving a rod (such as rod 23, FIGS. 1–5; not shown in FIG. 6). Reduced aperture 44 is preferably configured to yield to sliding insertion of a rod to establish a gripping relation between inductor assembly 16b and the inserted rod at reduced aperture 44. Support member 20b provides the same benefits as other embodiments of the apparatus of the present invention described in connection with FIGS. 1–5: captively affixing inductor member 18b on a rod (not shown in FIG. 6); cushioning impact of any physical forces on inductor member 18b; and reducing the risk of fracture or breaking of the rod, inductor member 18b or joints associated with including the rod within an electrical circuit.

Figure 7:
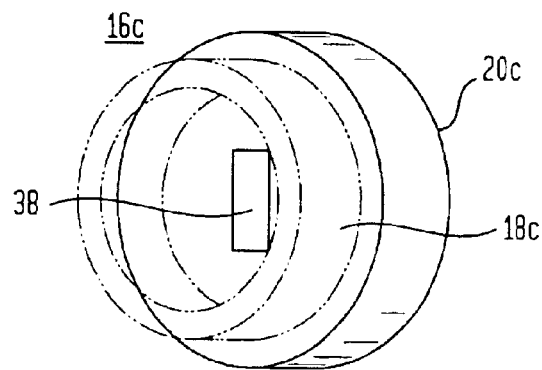
FIG. 7 is an isometric view of a third alternate embodiment of the apparatus of the present invention.

FIG. 7 is an isometric view of a third alternate embodiment of the apparatus of the present invention. In FIG. 7, an inductor assembly 16c includes an inductor member 18c (shown in phantom) and a support member 20c. Support member 20c preferably has physical dimensions substantially the same as the physical dimensions of shoulder 34 (FIGS. 2 and 3) and presents an aperture 38 for receiving a rod. Support member 20c is configured as a "snap-on" fixture. Support member 20c is sufficiently elastomeric to accommodate stretching appropriately for elastically receiving and holding inductor member 18c in the configuration illustrated in FIG. 7. Another embodiment (not illustrated) contemplates assembling two facing support members 20c upon a single inductor member 18c to cooperate in elastically receiving and holding inductor member 18c in a substantially fully enclosed holding relation within two support members 20c.

Aperture 38 is preferably configured to yield to sliding insertion of a rod to establish a gripping relation between inductor assembly 16c and the inserted rod at aperture 38. Support member 20c provides the same benefits as other embodiments of the apparatus of the present invention described in connection with FIGS. 1–6: captively affixing inductor member 18c on a rod (not shown in FIG. 7); cushioning impact of any physical forces on inductor member 18c; and reducing the risk of fracture or breaking of the rod, inductor member 18c or joints associated with including the rod within an electrical circuit.

Figure 8:
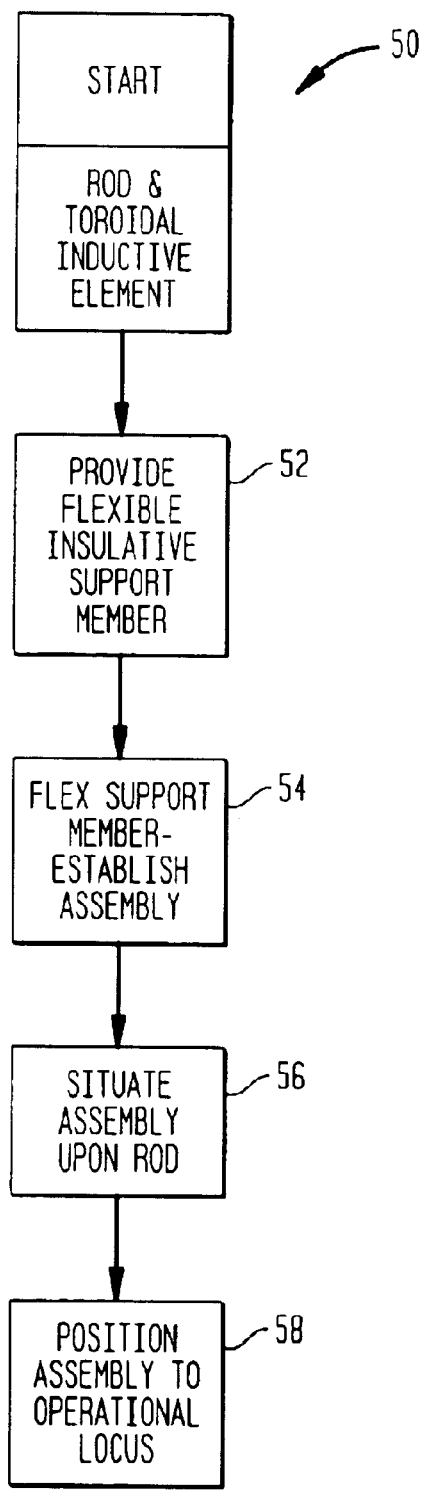
FIG. 8 is a flow diagram illustrating the method of the present invention.

FIG. 8 is a flow diagram illustrating the method of the present invention. In FIG. 8, the method for installing a toroidal element upon a rod in an electrical device begins, as indicated by a block 50, with a rod having a first longitudinal axis and a diametral dimension. The toroidal element presents an aperture having an inner toroid dimension.

The method continues with providing a flexible insulative support member, as indicated by a block 52. The support member has a second longitudinal axis extending from a first end to a second end, an inner support dimension generally equal to the diametral dimension of the rod and an outer support dimension generally equal to the inner toroid dimension of the toroidal element.

Continuing the method, as indicated by a block 54, the support member is flexed to situate the support member within the aperture of the toroidal element with the toroidal element intermediate the first end and the second end of the support member. There is thereby formed an assembly including the inductive element and the support member.

The method continues, as indicated by a block 56, situating the assembly upon the rod with the first longitudinal axis generally aligned with the second longitudinal axis. The final step of the method, as indicated by a block 58, slidingly positions the assembly with respect to the rod to achieve a desired operational locus.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. An apparatus for affixing an inductive element in association with a rod in an electrical circuit; said rod having a diametral dimension; said inductive element having a generally toroidal shape with an inductive element inner dimension; the apparatus comprising: a support member; said support member being flexible to a plurality of orientations, said plurality of orientations including an installing orientation and an installed orientation; said support member being substantially tubular with a first end, a second end, an inner wall defining a support member inner dimension and an outer wall defining a support member outer dimension; said support member inner dimension being substantially equal to or less than said diametral dimension; said support member flexing to said installing orientation when installing said inductive element; said installing orientation establishing said support member outer dimension at less than said inductive element inner dimension appropriately to allow sliding installation of said inductive element about said support element and said rod to an installed position; said installed position being achieved when said inductive element surrounds said support member and said rod with said inductive element situated intermediate said first end and said second end with said support member flexed to said installed orientation; said installed orientation establishing said support member outer dimension at greater than said inductive element inner dimension intermediate said inductive element and at least at one end of said first end and said second end.

2. An apparatus for affixing an inductive element in association with a rod in an electrical circuit as recited in claim 1 wherein one end of said first end and said second end of said support member includes an integrally formed shoulder having an outer shoulder dimension greater than said inductive element inner dimension.

3. An apparatus for affixing an inductive element in association with a rod in an electrical circuit as recited in claim 1 wherein said support member is comprised of electrically insulative material.

4. An apparatus for affixing an inductive element in association with a rod in an electrical circuit as recited in claim 1 wherein said support member inner dimension is appropriate to establish a gripping relation between said support member and said rod at at least one locus intermediate said first end and said second end in said installed orientation.

5. An apparatus for affixing an inductive element in association with a rod in an electrical circuit as recited in claim 2 wherein said integrally formed shoulder provides an entry aperture for said rod; said entry aperture being configured for interference gripping by said shoulder element upon said rod appropriate to permit sliding installation forces to move said support member to an installed locus with respect to said rod with said inductive element in said installed position; said interference gripping being sufficient to resist dislodging said support member from said installed locus during normal operation of said electrical circuit.

6. An apparatus for affixing an inductive element in association with a rod in an electrical circuit as recited in claim 2 or 5 wherein said support member is comprised of electrically insulative material.

7. An apparatus for affixing an inductive element in association with a rod in an electrical circuit as recited in claim 2 or 5 wherein said support member inner dimension is appropriate to establish a gripping relation between said support member and said rod at at least one locus intermediate said first end and said second end in said installed orientation.

8. An apparatus for fixedly situating a toroidal element in encircling relation with a rod in an electrical circuit; said rod having a diametral dimension; said toroidal element having an inner toroidal dimension greater than said diametral dimension; the apparatus comprising a flexible insulative tubular support element oriented substantially about a longitudinal axis; said support element having an inner support dimension and an outer support dimension; said inner support dimension being substantially equal with said diametral dimension, said support element flexing to establish a mutual interference non-conductive relation among said rod, said support element and said toroidal element in an installed orientation with said toroidal element located in said encircling relation with said support element and said rod, with said rod traversing said support element substantially along said longitudinal axis, and with said support element extending beyond said toroidal element along said longitudinal axis in two directions; said mutual interference relation resisting dislodgment of said toroidal element and said support element from said installed orientation.

9. An apparatus for fixedly situating a toroidal element in encircling relation with a rod in an electrical circuit as recited in claim 8 wherein said resisting dislodgment is effected by said outer support dimension being greater than said inner toroidal dimension generally adjacent said toroidal element.

10. An apparatus for fixedly situating a toroidal element in encircling relation with a rod in an electrical circuit as recited in claim 8 wherein said resisting dislodgment is effected by said outer support dimension and said inner toroidal dimension being appropriate to establish a gripping relation between said toroidal element and said support element.

11. A method for installing an inductive toroidal element upon a rod in an electrical device; said rod having a first longitudinal axis and a diametral dimension; said toroidal element presenting an aperture having an inner toroid dimension; the method comprising the steps of:

(a) providing a flexible insulative support member; said support member having a second longitudinal axis extending from a first end to a second end, an inner support dimension generally equal to said diametral dimension and an outer support dimension generally equal to said inner toroid dimension;

(b) flexing said support member to situate said support member within said aperture with said toroidal element intermediate said first end and said second end to establish an assembly;

(c) situating said assembly upon said rod with said first longitudinal axis generally aligned with said second longitudinal axis; and slidingly positioning said assembly with respect to said rod to achieve an operational locus.

* * * * *